US012576475B2

(12) United States Patent
Lu et al.

(10) Patent No.: US 12,576,475 B2
(45) Date of Patent: Mar. 17, 2026

(54) DETERMINING THE ORIENTATION OF A SUBSTRATE IN-SITU

(71) Applicant: Applied Materials, Inc., Santa Clara, CA (US)

(72) Inventors: Wei Lu, Fremont, CA (US); Shih-Haur Shen, Santa Clara, CA (US); David Maxwell Gage, San Jose, CA (US); Jimin Zhang, San Jose, CA (US); Taketo Sekine, Cuppertino, CA (US); Haosheng Wu, Fremont, CA (US); Kun Xu, Fremont, CA (US); Jianshe Tang, San Jose, CA (US); Brian J. Brown, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 339 days.

(21) Appl. No.: 18/139,091

(22) Filed: Apr. 25, 2023

(65) Prior Publication Data

US 2024/0359291 A1    Oct. 31, 2024

(51) Int. Cl.
B24B 49/10      (2006.01)
B24B 37/34      (2012.01)
H01L 21/68      (2006.01)

(52) U.S. Cl.
CPC ............ B24B 49/10 (2013.01); B24B 37/345 (2013.01); H01L 21/68 (2013.01)

(58) Field of Classification Search
CPC ... H01L 22/26; H01L 21/3212; B24B 37/013; B24B 37/005; B24B 37/042; B24B 37/30; B24B 37/205; B24B 49/12; B24B 49/105; B24B 49/04; B24B 49/102; B24B 49/16; B24B 7/228

USPC ................................. 451/5, 6, 8, 9, 41, 287
See application file for complete search history.

(56)                  References Cited

U.S. PATENT DOCUMENTS

| | | | |
|---|---|---|---|
| 4,819,167 | A | 4/1989 | Cheng et al. |
| 4,927,485 | A | 5/1990 | Cheng et al. |
| 5,100,502 | A | 3/1992 | Murdoch et al. |
| 6,537,133 | B1 | 3/2003 | Birang et al. |
| 6,837,983 | B2 | 1/2005 | Duboust et al. |

(Continued)

FOREIGN PATENT DOCUMENTS

| | | |
|---|---|---|
| KR | 10-2015-0087527 A | 7/2015 |
| KR | 10-2022-0003286 A | 1/2022 |

OTHER PUBLICATIONS

International Search Report and Written Opinion in related application PCT/US2024/012868 dated May 22, 2024.

*Primary Examiner* — Robert F Neibaur
(74) *Attorney, Agent, or Firm* — Patterson + Sheridan, LLP

(57)                  ABSTRACT

A method of processing a substrate includes polishing a front surface of a substrate on a first pad coupled to a first platen. The method further includes transferring the substrate from the first pad to a second pad coupled to a second platen with a carrier head. The method further includes moving the carrier head to a scan position to place an edge of the substrate above an orientation sensor disposed at a rotational center of the second pad. The method further includes scanning the edge of the substrate with the orientation sensor to produce a signal. The method further includes analyzing the signal to locate a reference mark of the substrate to determine a rotational orientation of the substrate relative to the carrier head.

18 Claims, 9 Drawing Sheets

(56) References Cited

U.S. PATENT DOCUMENTS

| | | | |
|---|---|---|---|
| 7,024,063 B2 | 4/2006 | Tang | |
| 8,747,686 B2 | 6/2014 | Zheng et al. | |
| 9,333,621 B2 | 5/2016 | Swedek et al. | |
| 9,360,535 B2 | 6/2016 | Freire Rosales et al. | |
| 9,601,396 B2 | 3/2017 | Lian | |
| 9,649,743 B2 | 5/2017 | David et al. | |
| 10,207,386 B2 | 2/2019 | Xu et al. | |
| 10,556,315 B2 | 2/2020 | Xu et al. | |
| 10,589,397 B2 | 3/2020 | Duboust et al. | |
| 11,022,877 B2 | 6/2021 | Grimbergen et al. | |
| 2005/0077188 A1 | 4/2005 | Mao et al. | |
| 2008/0156657 A1 | 7/2008 | Butterfield et al. | |
| 2019/0134775 A1 | 5/2019 | Xu et al. | |
| 2020/0094370 A1* | 3/2020 | Cherian | G06N 3/084 |
| 2021/0066142 A1* | 3/2021 | Lau | B24B 49/12 |
| 2022/0077006 A1 | 3/2022 | Benvegnu et al. | |
| 2022/0379428 A1 | 12/2022 | Zhang et al. | |
| 2022/0384278 A1 | 12/2022 | Wong et al. | |
| 2022/0388116 A1 | 12/2022 | Oh et al. | |

* cited by examiner

DETERMINING THE ORIENTATION OF A SUBSTRATE IN-SITU

BACKGROUND

Field

The present disclosure relates to chemical mechanical polishing (CMP), and more specifically to analyzing the endpoint of the CMP process.

Description of the Related Art

An integrated circuit is typically formed on a substrate by the sequential deposition of conductive, semiconductive, and/or insulative layers on a semiconductor substrate. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill trenches and holes in the insulative layer. After planarization, the remaining portions of the metal in the trenches and holes of the patterned layer form vias, plugs, and lines to provide conductive paths between integrated circuits (ICs) on the substrate. As another example, a dielectric layer can be deposited over a patterned conductive layer, and then planarized to enable subsequent photolithographic steps.

Chemical mechanical polishing (CMP) is one accepted method of planarization. This planarization method typically requires that the substrate be mounted on a carrier head. The exposed surface of the substrate, the surface with the layer deposition, is typically placed against a rotating polishing pad. The carrier head provides a controllable load on the substrate to urge it against the polishing pad. A polishing slurry with abrasive particles is typically supplied to the surface of the polishing pad and spreads in between the substrate and the polishing pad. The polishing pad and the carrier head each rotate at a constant rotational speed and the abrasive slurry removes material from one or more of the layers.

Conventional CMP operations, however, cannot determine the rotational orientation of the substrate relative to the carrier head after the substrate is transferred to the polishing pad. As a result, the rotational orientation of the substrate is unknown during the endpoint analysis of conventional CMP processes. There is a need in the art to determine the rotational orientation of a substrate relative to a carrier head in situ to improve the endpoint analysis of a CMP process.

SUMMARY

In one embodiment, a method of processing a substrate includes polishing a front surface of a substrate on a first pad coupled to a first platen. The method further includes transferring the substrate from the first pad to a second pad coupled to a second platen with a carrier head. The method further includes moving the carrier head to a scan position to place an edge of the substrate above an orientation sensor disposed at a rotational center of the second pad. The method further includes scanning the edge of the substrate with the orientation sensor to produce a signal. The method further includes analyzing the signal to locate a reference mark of the substrate to determine a rotational orientation of the substrate relative to the carrier head.

In one embodiment, a method of polishing a substrate includes scanning an edge of a substrate using an orientation sensor located at a rotational center of a platen. The method further includes analyzing data obtained by the orientation sensor to determine a location of a reference mark of the substrate in relation to a carrier head holding the substrate. The method further includes polishing a front surface of the substrate. The method further includes monitoring the front surface during polishing with an endpoint sensor embedded in the platen that scans the front surface. Monitoring includes identifying portion of the front surface being scanned by the endpoint sensor using the determined location of the reference mark in relation to the carrier head.

In one embodiment, a polishing system includes a polishing station that comprises a platen, a carrier head, an orientation sensor, a plurality of endpoint sensors, and a controller. The platen includes a polishing pad. The carrier head is configured to rotate a substrate. The orientation sensor is embedded in the platen at the rotational center of the platen. The orientation sensor is configured to scan an edge of a substrate that includes a reference mark. The plurality of endpoint sensors are embedded in the platen around the orientation sensor. Each endpoint sensor is configured to monitor a surface of the substrate being polished on the pad. The controller is in communication with the orientation sensor and the endpoint sensors. The controller is configured to analyze data obtained by the orientation sensor to identify a location of the reference mark relative to the carrier head.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

An apparatus and methods for determining the rotational orientation of a substrate in situ are disclosed herein. This rotational orientation is used to improve the endpoint analysis of a chemical mechanical polishing (CMP) process.

Figure 1:
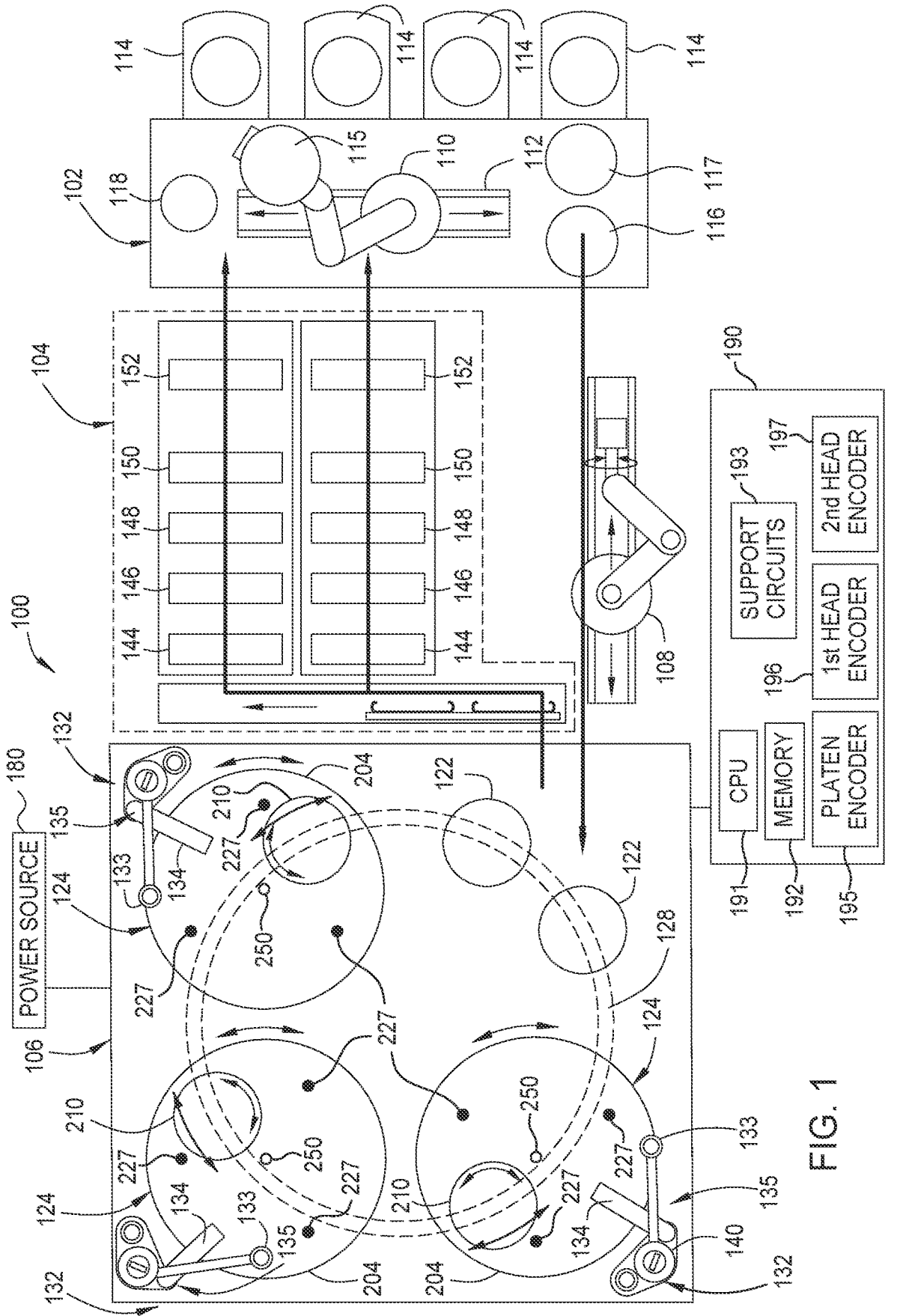
FIG. 1 depicts a schematic top view of an exemplary chemical mechanical polishing (CMP) system.

FIG. 1 is a top plan view illustrating one embodiment of a CMP system 100. The CMP system 100 includes a factory interface module 102, a cleaner 104, a polishing module 106, and a controller 190. A substrate 115, such as a silicon wafer with one or more layers deposited thereon, is processed within the CMP system 100 to polish the surface of the substrate 115.

A wet robot 108 is provided to transfer the substrates 115 between the factory interface module 102 and the polishing module 106. The wet robot 108 may also be configured to transfer the substrates 115 between the polishing module 106 and the cleaner 104. The factory interface module 102 includes a dry robot 110 which is configured to transfer the substrates 115 between one or more cassettes 114, one or more transfer platforms 116, one or more metrology stations 117, and one or more pre-aligner stations 118 of the factory interface 102. Substrates 115 are loaded into the CMP system 100 via the cassettes 114. In one embodiment depicted in FIG. 1, four substrate storage cassettes 114 are shown. The dry robot 110 within the factory interface 102 has sufficient range of motion to facilitate transfer between the four cassettes 114 and the one or more transfer platforms 116. Optionally, the dry robot 110 may be mounted on a rail or track 112 to position the robot 110 laterally within the factory interface module 102. The dry robot 110 additionally is configured to receive the substrates 115 from the cleaner 104 and return the clean polished substrates to the substrate storage cassettes 114.

FIG. 1 shows an exemplary polishing module 106 that includes a plurality of polishing stations 124 on which the substrates 115 are polished while being retained in a carrier head 210 (e.g., polishing head). Each polishing station 124 includes a conditioning assembly 132 and a polishing fluid delivery module 135. While the polishing module 106 is shown having three polishing stations 124, the polishing module 106 may have more than three polishing stations 124. For example, the polishing module 106 may have a two pairs of polishing stations 124, each pair of stations 124 processing a substrate 115 independently of the other pair. The polishing stations 124 are sized to interface with one or more carrier heads 210 to facilitate polishing the substrate 115. The carrier heads 210 are coupled to a carriage (not shown) that is mounted to an overhead track 128 that is shown in phantom in FIG. 1. The overhead track 128 allows the carriage to be selectively positioned around the polishing module 106 which facilitates positioning of the carrier heads 210 selectively over the polishing stations 124 and the load cup 122. In the embodiment depicted in FIG. 1, the overhead track 128 has a circular configuration which allows the carriages retaining the carrier heads 210 to be selectively and independently rotated over and/or clear of the load cups 122 and the polishing stations 124. Additionally, the overhead tracks 128 facilitate the carriage sweeping the rotating carrier heads 210 relative to a polishing station 124 during polishing. The polishing stations 124 will be described in greater detail in relation to FIG. 2.

Each polishing station 124 includes a polishing pad 204 having a polishing surface (e.g., a polishing surface 204A in FIG. 2) capable of polishing a substrate 115. Each polishing station 124 includes a conditioning assembly 132 and a polishing fluid delivery module 135. In one embodiment, the conditioning assembly 132 may comprise a pad conditioning assembly 140 which dresses the polishing surface of the polishing pad 204 by removing polishing debris and opening the pores of the polishing pad 204 by use of a pad condition disk 133. In another embodiment, the polishing fluid delivery module 135 may comprise a fluid delivery arm 134 to deliver a slurry. In one embodiment, each polishing station 124 comprises a pad conditioning assembly 132. In one embodiment, the fluid delivery arm 134 is configured to deliver a fluid stream (e.g., a slurry 222 in FIG. 2) to a polishing station 124. The polishing pad 204 is supported on a platen (e.g., a platen 202 in FIG. 2) which rotates the polishing pad 204 during processing. Each polishing station 124 includes a polishing pad 204 secured to a rotatable platen 202. Different polishing pads 204 may be used at different polishing stations 124 to control the material removal of the substrate 115.

At least one load cup 122, such as the two load cups 122 shown in FIG. 1, is near the lower right corner of the polishing module 106 between the polishing stations 124 closest to the wet robot 108. The load cups 122 may serve multiple functions, including washing the carrier head 210, receiving the substrate 115 from the wet robot 108, washing the substrate 115, and loading the substrate 115 into the carrier heads (e.g., a carrier head 210 in FIG. 2).

The substrate 115 will typically have a reference mark, such as a notch, flat edge, or other type of feature that can be used to identify crystalline orientations of the substrate 115 and note a rotational orientation of a front surface of the substrate 115 relative to a central axis. In certain embodiments, the factory interface module 102 can also include a pre-aligner 118 to position the substrate 115 in a known and desirable rotational orientation. The pre-alignment of the substrate 115 to a desired rotational orientation allows the substrate 115 to be transferred to the load cup 122 having a known rotational orientation. Thus, the carrier head 210 is able to retrieve the substrate 115 at a known rotational orientation relative to the carrier head 210. For example, the pre-aligner 118 may include a reference mark detection system, such as an optical interrupter sensor (not shown), to sense when the reference mark is at a specific angular position.

In certain embodiments, the substrate 115 is placed in the metrology station 117 by the dry robot 110 prior to placing the substrate 115 on the transfer platform 116. For example, the dry robot 110 may transfer the substrate 115 from the pre-aligner 118 to the metrology station 117. The metrology station 117 is used to measures various aspects of the substrate 115. The metrology station 117 may use an optical, eddy current, resistive, or other sensors to measure the substrate 115. For example, the metrology station 117 may measure a thickness of the upper layer on the patterned surface of the substrate 115. The controller 190 receives the measurements which may be used to facilitate processing the substrate 115 within the CMP system 100. The dry robot 110 may transfer the substrate 115 to the transfer platform 116 after the substrate 115 is measured in the metrology station 117.

The wet robot 108 is configured to transfer the substrate 115 from the transfer platform 116 to one of the load cups 122. A rinsed-clean carrier head 210 is moved above the load cup 122 with the unpolished substrate 115. The unpolished substrate 115 is thereafter chucked to the carrier head 210, which then moves to a position above the pad 204 of a polishing station 124 to begin the CMP process.

The controller 190 controls aspects of the CMP system 100 during a CMP process (e.g., polishing process, polishing operation, polishing). In certain embodiments, the controller 190 is one or more programmable digital computers executing digital control software. The controller 190 can include a CPU (e.g., processor) 191 situated near the polishing apparatus, e.g., a programmable computer, such as a personal computer. The controller can include a memory 192 and support circuits 193. The controller 190 can, for example, coordinate rotation of the polishing pad 204 and the carrier head 210 to perform the desired CMP process and to facilitate monitoring for the endpoint of the CMP process. The CMP process system 100 is powered by power source 180, such as an electric power source configured to supply electric power to the components of the CMP process system 100.

The platen 202 and the carrier head 210 each have a rotation sensor such as an encoder, to determine their rotational position during the CMP operation. As shown in FIG. 1, a platen encoder 195, a first head encoder 196, and a second head encoder 197 are integrated into the controller 190. The platen encoder 195 is configured to determine the rotational (e.g., angular) orientation of the platen 202 and the pad 204. The first head encoder 196 is configured to determine the rotational orientation of each carrier head 210. The second head encoder 197 is configured to determine the location of each carrier head 210 above the polishing pad 204 (e.g., along the sweep path 302 of the carrier head 210 in FIG. 3A). Thus, the controller 190 is able to determine and track the rotational orientation of the carrier head 210 with respect to the platen 202 during the CMP process. In some embodiments, each carrier head 210 has its own dedicated first and second head encoders 196, 197. In further embodiments, the controller 190 may calculate a rotation rate of the carrier head 210 and/or platen 202 and polishing pad 204 using the encoder and an internal timing element.

The substrate 115 may be polished in one or more of the polishing stations 124. For example, a carrier head 210 may retrieve an unpolished substrate 115 from a load cup 122. The carrier head 210 and substrate 115 chucked thereto are then moved to a first polishing station 124, such as the polishing station 124 in the upper right corner of the polishing module 106 closest to the cleaner 104. The substrate 115 is then subjected to a CMP polishing operation on the first polishing station 124, such as removing a first layer formed on the substrate 115. Once the substrate 115 is done polishing in the first polishing station 124, then the carrier head 210 moves the substrate 115 to a second polishing station 124 (e.g., the polishing station 124 in the upper left corner of the polishing module 106) for additional CMP polishing. For example, the second polishing station 124 may polish the surface of the substrate 115 to form trench lines of a desired height. In some embodiments, the carrier head 210 and substrate 115 may optionally be transferred from the second polishing station 124 to a third polishing station 124 (e.g., the polishing station 124 in the lower left corner of the polishing module 106) to subject the substrate 115 to additional polishing.

After polishing, the carrier head 210 moves the polished substrate 115 chucked thereto above a load cup 122 where the polished substrate 115 is thereafter placed into the load cup 122. The wet robot 108 transports the polished substrate 115 from the load cup 122 to a cleaning chamber in the cleaner 104, where slurry residues and other contaminants that have accumulated on the substrate's 115 surface during polishing are removed. In the embodiment depicted in FIG. 1, the cleaner 104 includes two pre-clean modules 144, two megasonic cleaner modules 146, two brush box modules 148, two spray jet modules 150, and two dryers 152. The dry robot 110 then removes the substrate 115 from the cleaner 104. In some embodiments, the dry robot 110 transfers the substrate 115 to the metrology station 117 to be measured again. In certain embodiments, the post-polish measurements can be used to adjust the polishing process parameters for a subsequent substrate. Finally, the dry robot 110 returns the substrate 115 to one of the cassettes 114.

Figure 2A:
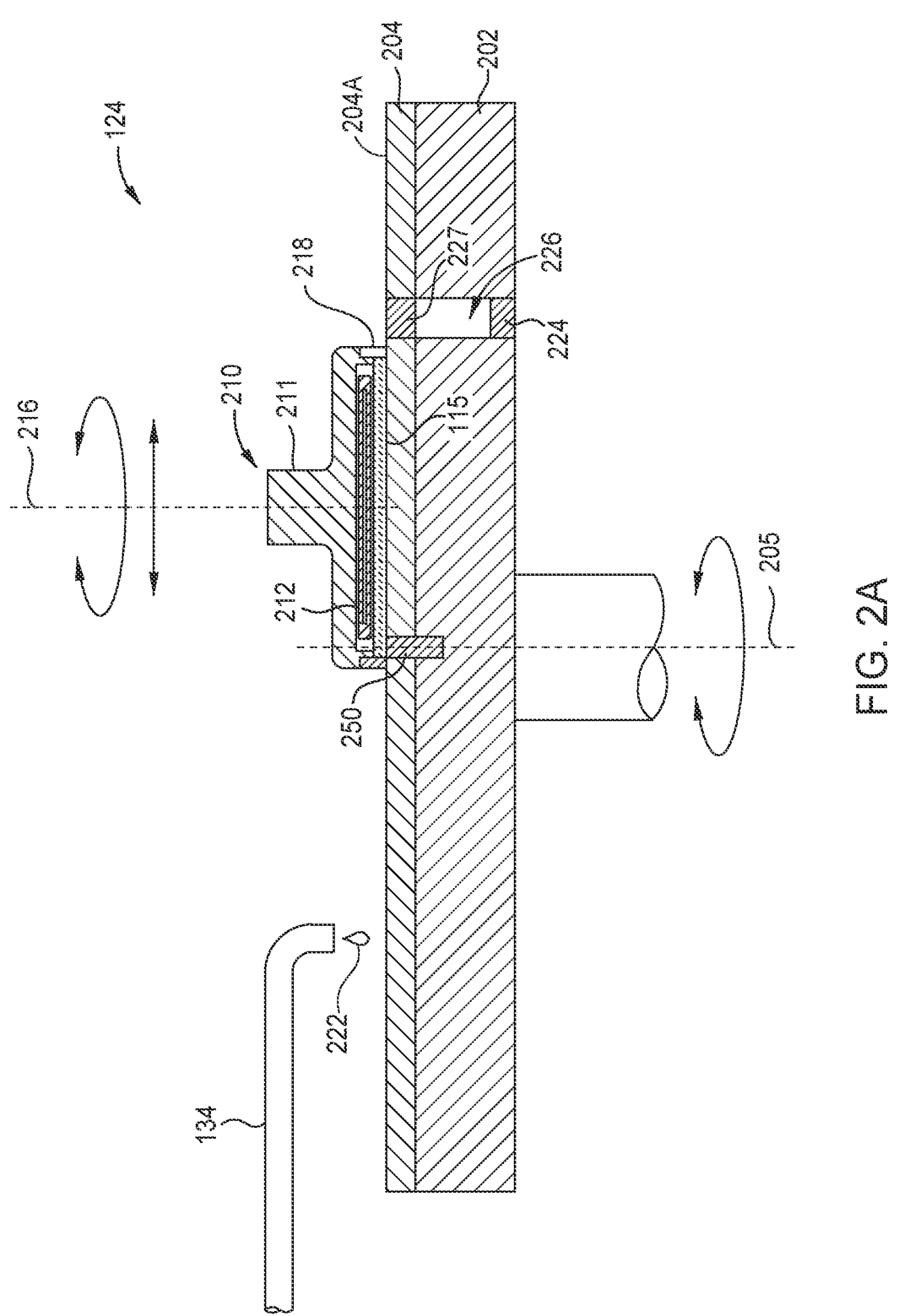
FIG. 2A depicts a schematic sectional view of an exemplary polishing station of the CMP system from FIG. 1 according to embodiments described herein.

FIG. 2A illustrates a schematic cross-sectional view of a polishing station 124 of the CMP system 100 of FIG. 1. As shown, the polishing station 124 further includes a plurality of endpoint detection sensors 224 and an orientation sensor 250. A substrate 115 disposed in the carrier head 210 is shown engaged with the polishing surface 204A of the pad 204 that is coupled to the platen 202.

Figure 2B:
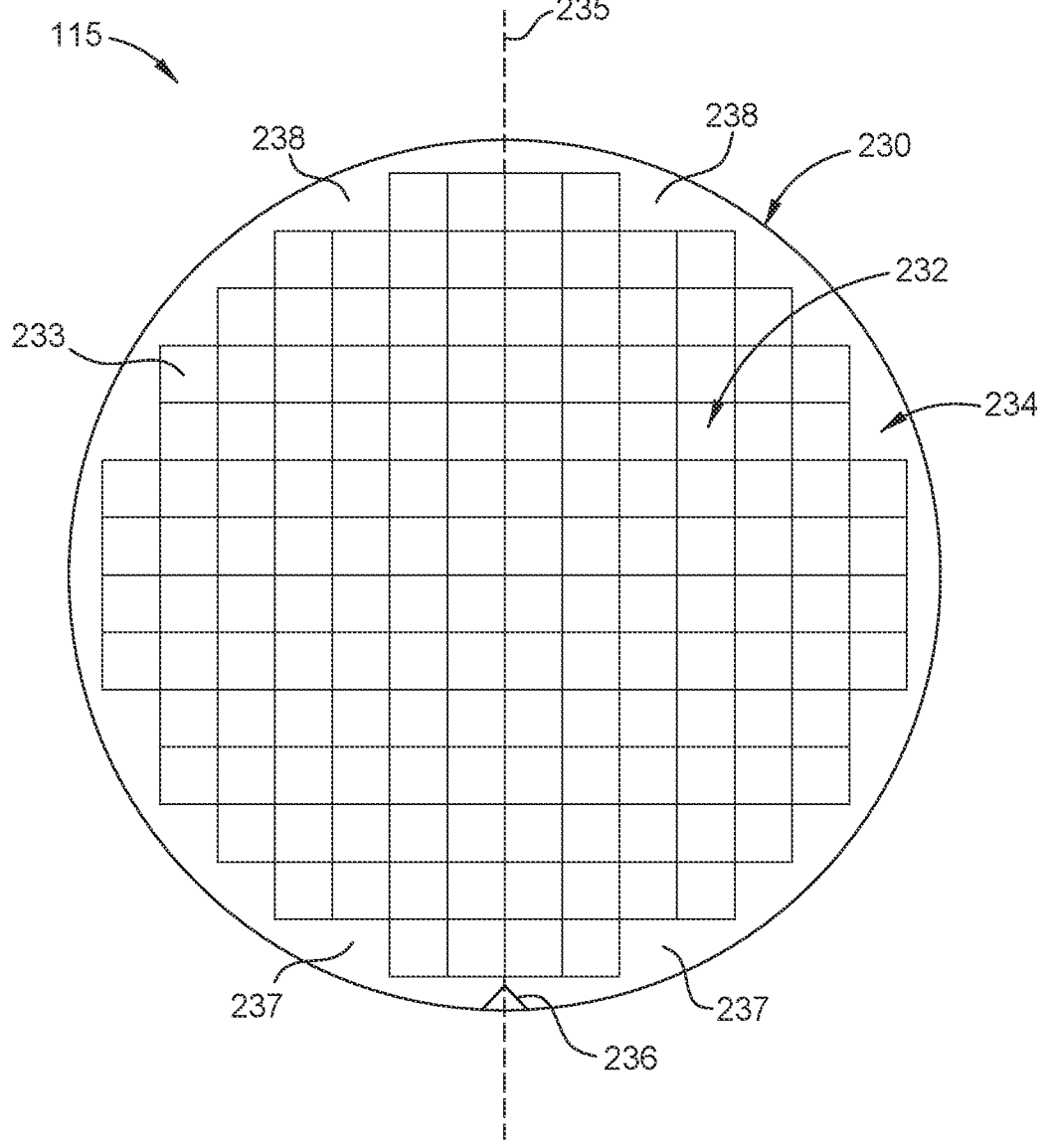
FIG. 2B is a top view of a front surface of a substrate polished on the polishing station of FIG. 2A according to embodiments described herein.

FIG. 2B is a top view of the substrate 115 to illustrate the front surface 230 of the substrate 115 that is engaged with the polishing pad 204 during polishing. The front surface 230 includes a patterned portion 232 and a non-patterned portion 234. The patterned portion 232 (e.g., patterned surface) is the portion of the substrate 115 were a plurality semiconductor devices are formed during one or more processes. As shown, the patterned portion 232 is divided into a plurality of full dies 233 arranged in a grid-pattern. Each die 233 is a particular semiconductor device being formed on the substrate 115. For example, the semiconductor devices include one or more layers formed by from one or more processes, such as through physical vapor deposition (PVD) or atomic layer deposition (ALD).

The non-patterned portion 234 is the portion of the front surface 230 around the patterned portion 232. Semiconductor devices are not formed on the non-patterned surface 234. The non-patterned portion 234 may be exposed to the same processing environments that forms the patterned portion 232. Materials, such as barrier metals, may be deposited on the non-patterned surface 234 while the semiconductor devices are formed on the patterned portion 232. In some embodiments, the non-patterned portion 234 may be a partially patterned portion that includes only partial, and not full, dies. The surface area of the non-patterned portion 234 may not be uniform around the patterned portion 232. As shown in FIG. 2B, the surface area of the non-patterned surface 234 fluctuates around the patterned portion 232 depending on the shape of the patterned portion 232. Thus, there are portions of the non-patterned surface 234 with a surface area greater than other portions.

The substrate 115 includes a reference mark 236 at the edge of the substrate 115 and thus at the edge of the non-patterned portion 234. The reference mark 236 is a fixed feature formed on the substrate 115 depending on the doping type and crystalline orientation of the substrate 115. While the reference mark 236 is shown as a v-shaped notch formed on the edge of the substrate 115 in FIG. 2B, the reference mark 236 may be another feature. For example, the reference mark 236 may be one or more flat edges of the substrate 115.

The substrate 115 has a first line of symmetry 235 that passes through the center of the reference mark 236. The non-patterned surface 234 is generally symmetrical about this first line of symmetry 235. Thus, there is a first region 237 on either side of the line of symmetry 235 adjacent to the reference mark 236 that has substantially the same surface area. Additionally, there is a similar pair of second regions 238 on the opposite edge of the substrate 115 as the reference mark 236 that has a similar surface area as the first region 237. While the non-patterned surface 234 may be generally symmetric about the first line of symmetry 235, the circuits formed in the individual dies 233 of the patterned surface 232 may or may not be symmetric about this first line of symmetry 235.

Referring back to FIG. 2A, the polishing pad 204 is secured to the platen 202, such as being secured using an adhesive, such as a pressure sensitive adhesive (PSA) layer (not shown), disposed between the polishing pad 204 and the platen 202. The carrier head 210, facing the platen 202 and the polishing pad 204 mounted thereon, includes a flexible diaphragm 212 configured to impose different pressures against a backside surface of a substrate 115 that is disposed between the carrier head 210 and the polishing pad 204. This flexible diaphragm 212 is also configured to chuck the substrate 115 to the carrier head 210 to allow the carrier head 210 to move the substrate 115 around the polishing module 106. The carrier head 210 includes a carrier ring 218 surrounding the substrate 115 which holds the substrate 115 within the head 210 during polishing. The carrier head 210 rotates about a carrier head axis 216 while the flexible diaphragm 212 urges the front surface 230 (FIG. 2B) of the substrate 115 against the polishing surface 204A of the polishing pad 204. During polishing, a downforce on the carrier ring 218 urges the carrier ring 218 against the polishing pad 204 to improve the polishing process uniformity and prevent the substrate 115 from slipping out from under the carrier head 210. In certain embodiments, the carrier head 210 includes a shaft 211 which has an axis that is colinear with carrier head axis 216. In further embodiments, the platen 202 and the carrier head 210 each have a mechanism or motor (not shown) driving their rotation.

In some embodiments, the platen 202 and polishing pad 204 both rotate about a common platen axis 205. In some embodiments, the polishing pad 204 rotates in the same rotational direction as the rotation direction of the carrier head 210. For example, the polishing pad 204 and carrier head 210 both rotate in a counter-clockwise direction. The polishing pad 204 and carrier head 210 may be rotated at the same or different speed during a polishing operation. As shown in FIG. 2A, the polishing pad 204 has a surface area that is greater than the front surface 230 of the substrate 115.

However, in further embodiments, the polishing pad 204 has a surface area that is less than the surface area of the front surface 230 of the substrate 115.

FIG. 2A also shows an exemplary embodiment of one of the endpoint detection sensors 224. Each endpoint detection sensors 224 is positioned radially from the platen axis 205. The endpoint sensor 224 is disposed in a platen opening 226 formed in the platen 202 and beneath an optically transparent feature 227 (e.g., window) of the polishing pad 204. The endpoint detection sensor 224 directs light through the platen opening 226 and window 227 at the front surface 230 of the substrate 115 to detect properties of the front surface 230 as the endpoint sensor 224 passes beneath the substrate 115 during polishing. The controller 190 uses the data collected by the endpoint detection sensors 224 to determine when the endpoint of the CMP process is reached. The endpoint may be, for example, when a desired thickness of a layer formed on the patterned surface 232 is reached. For example, the endpoint may be reached when the metal in a plurality of trench lines formed on the patterned portion 232 reaches a desired thickness.

While the endpoint detection sensor 224 is shown as an optical sensor, the endpoint sensor 224 may be any other suitable sensor capable of monitoring changes in the patterned portion 232 during the CMP process. For example, the endpoint sensor 224 may be an eddy current sensor or an inductive current sensor. The eddy current sensor and inductive current sensor may be embedded in the platen 202 and/or pad 204, and the transparent features 227 and opening 226 may be omitted. While the polishing station 124 is shown having three endpoint detection sensors 224 disposed around the orientation sensor 250, as evidenced by the three transparent features 227 in FIG. 1, the polishing station 124 may include less than or more than three endpoint sensors 224.

Each endpoint detection sensor 224 is positioned at a fixed distance from the rotational center (e.g., platen axis 205) of the platen 202. The platen encoder 195 tracks the rotational position of the platen 202 and pad 204. The controller 190 is able to determine the location of the endpoint sensor 224 as the platen 202 rotates based on the fixed location of the endpoint sensor 224 and the rotational information obtained from the platen encoder 195.

FIG. 2A also shows the orientation sensor 250. As will be discussed in relation to FIGS. 3A and 3B, the orientation sensor 250 is used to locate the reference mark 236 in-situ so that the controller 190 can determine the rotational orientation of the substrate 115 relative to the carrier head 210 and the pad 204. The controller 190 is able to correlate the ascertained location of the reference mark 236 with respect to the rotational orientation of the carrier head 210 since the substrate 115 is rotating with the carrier head 210. The orientation sensor 250 is used to ascertain the substrate's 115 rotational orientation after the substrate 115 is transferred to a polishing station 124 from a different polishing station 124. In other words, the substrate 115 does not have to be removed from the polishing module 106, passed through the cleaner 104, and placed into the pre-aligner 118 or metrology station 117 to ascertain the rotational orientation of the substrate 115 prior to polishing substrate 115 on a second or third polishing station 124.

Knowing the rotational orientation of the substrate 115 and carrier head 210 and the location of each endpoint sensor 224 during polishing allows the controller 190 to ascertain which part of the front surface 230 of the substrate 115 is being scanned by a particular endpoint sensor 224. In other words, the controller 190 can correlate the position and orientation of the substrate 115 with the position of each endpoint sensor 224 during the polishing process.

The orientation sensor 250 is located at the rotational center of the platen 202 such that the rotational axis of the sensor 250 is collinear with the platen axis 205. The end- point sensors 224 are arranged around the orientation sensor 250 and orbit around the platen axis 205 as the platen 202 rotates. To find the reference mark 236, the carrier head 210 is moved to a scan position as shown in FIG. 2A (see also FIG. 3A) to place the edge of the substrate 115 above the orientation sensor 250. This allows the orientation sensor 250 to scan the edge of the substrate 115 to locate the reference mark 236. In some embodiments, the orientation sensor 250 scans the edge of the substrate 115 as the carrier head 210 makes one or more complete revolutions around the carrier head axis 216 in order to find the reference mark 236. In other embodiments, the reference mark 236 is located after only a partial revolution of the carrier head 210.

In some embodiments, and as shown in FIG. 2A, the orientation sensor 250 is an isotropic electromagnetic sen- sor. In some embodiments, the orientation sensor 250 is an eddy current sensor, an optical sensor, or other sensor capable of detecting the reference mark 236. As shown, the orientation sensor 250 is partially embedded in both the platen 202 and the pad 204. In some embodiments, the orientation sensor 250 is only embedded in the platen 202 and is covered by the pad 204.

In some embodiments, a layer partially or fully covers the front surface 230, with both the patterned portion 232 and non-patterned portion 234 being fully or partially covered by the layer. This layer may be deposited to form another layer or feature on the dies 233 of the patterned portion 232 that will be polished down in the CMP system. The orientation sensor 250 is still able to scan the edge of the substrate 115 to locate the reference mark 236 even if a layer is deposited over both the patterned portion 232 and the non-patterned portion 234. For example, the orientation sensor 250 may obtain data that shows the part of the layer scanned by the orientation sensor 250 was over the underlying patterned portion 232 or non-patterned portion 234. In other words, the controller 190 can differentiate between the patterned portion 232 and non-patterned portion 234 even if both are at least partially obscured by the same layer. Additionally, the data obtained by the orientation sensor 250 can show variations in the material being scanned, such as variations in the area of the non-patterned portion 234, even if a layer is fully or partially covering the front surface 230.

Figures 3A, 3B:
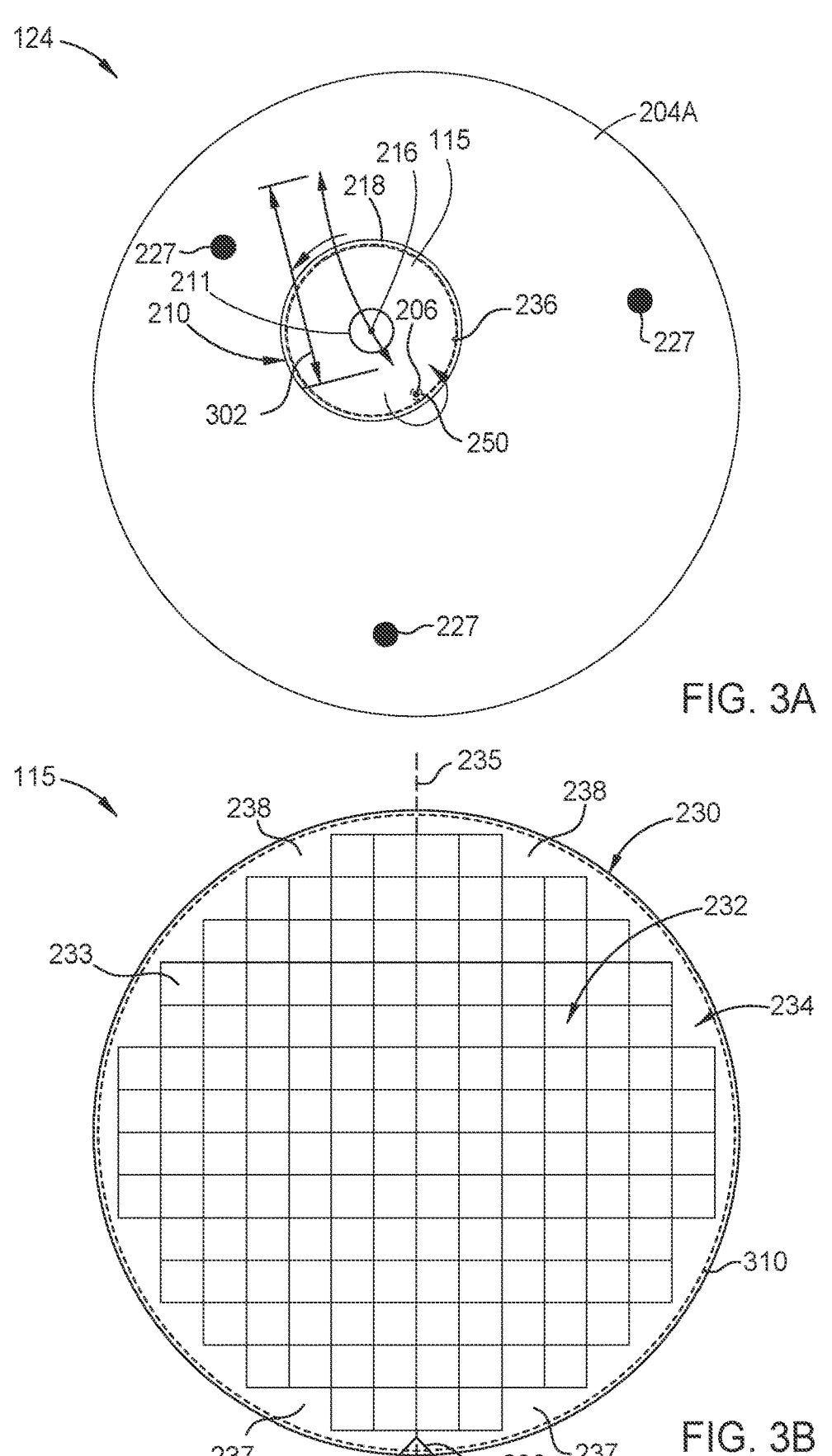
FIG. 3A depicts a schematic top view of the carrier head positioned at a scan position on the polishing pad from the polishing station of FIG. 2A according to embodiments described herein.
FIG. 3B depicts a top view of a front surface of a substrate scanned by an orientation sensor of the polishing station of FIG. 2A according to embodiments described herein.

FIG. 3A illustrates a top schematic plan view of the polishing station 124 to show the carrier head 210 in the scan position to find the reference mark 236. The conditioning assembly 132 and the polishing fluid delivery module 135 are omitted. The head 210 is moveable relative to the pad 204 along a sweep path 302 to sweep the substrate 115 along the polishing surface 204A during the polishing process. The endpoint sensors 224 cross the sweep path 302 as the platen 202 rotates. The endpoint sensors 224 pass beneath the substrate 115 when the carrier head 210 places the substrate 115 at one or more positions along the sweep path 302 that is in the travel path of the endpoint sensors 224 as the platen 202 rotates.

The carrier head 210 is shown in a scan position with the edge of the front surface 230 being at least partially posi- tioned above the orientation sensor 250. The carrier head 210 is rotated relative to the orientation sensor 250 and the platen 202 while the orientation sensor 250 makes a scan of the substrate 115 edge to locate the reference mark 236. The carrier head 210 is moved to the scan positon after the substrate 115 is transferred to a polishing station 124 from a different polishing station 124 in the polishing module 106 to allow a scan 310 (see FIG. 3B) to be taken of the front surface 230 of the substrate 115 to ascertain the rotational orientation of the substrate 115.

FIG. 3B illustrates the scan 310 of the front surface 230 of the substrate 115 by the orientation sensor 250. The scan 310 shows the path where the orientation sensor 250 passes below the front surface 230 to collect data as the carrier head 210 rotates the substrate 115 relative to the orientation sensor 250. The scan 310 is made near the edge of front surface 230. The scan 310 is made close enough to the edge of the substrate 115 such that the scan 310 passes through part of the reference mark 236. In some embodiments, the orientation sensor 250 makes a scan 310 below only the non-patterned surface 234 when the carrier head 210 is in the scan position. Alternatively, the orientation sensor 250 may complete a scan 310 along that edge of the substrate 115 that passes across both the patterned surface 232 and the non- patterned surface 234.

The orientation sensor 250 collects data about the front surface 230 along the scan 310. This data is sent to the controller 190 for analysis to determine the location of the reference mark 236. The first head encoder 196 simultane- ously records the rotational position of the carrier head 210 while the orientation sensor 250 collects data along the scan 310. The controller 190 correlates the data obtained from the orientation sensor 250 with the rotational position of the carrier head 210 for which the data was obtained. In other words, the controller 190 is able to match the data obtained from the orientation sensor 250 with the rotational positon of the carrier head 210. This allows the controller 190 to analyze the data to determine the location of the reference mark 236 in relation to the rotational orientation of the carrier head 210. Once the location of the reference mark 236 relative to the carrier head 210 is known, then the rotational orientation of the substrate 115 is known.

In some embodiments, the carrier head 210 makes just one revolution about the carrier head axis 216 for the orientation sensor 250 to collect sufficient data along the scan 310 to determine the location of the reference mark 236. In other embodiments, the carrier head 210 makes more than one complete revolution to collect sufficient data along the scan 310 to determine the location of the reference mark 236.

In some embodiments, the platen 202 and the carrier head 210 both rotate as the orientation sensor 250 scans the substrate 115. In other embodiments, the platen 202 remains stationary while the carrier head 210 is rotated to allow the orientation sensor 250 to scan the substrate 115. The con- troller 190 may cause the platen 202 to begin rotating to start the CMP process once the rotational orientation of the substrate 115 is ascertained.

Figure 4:
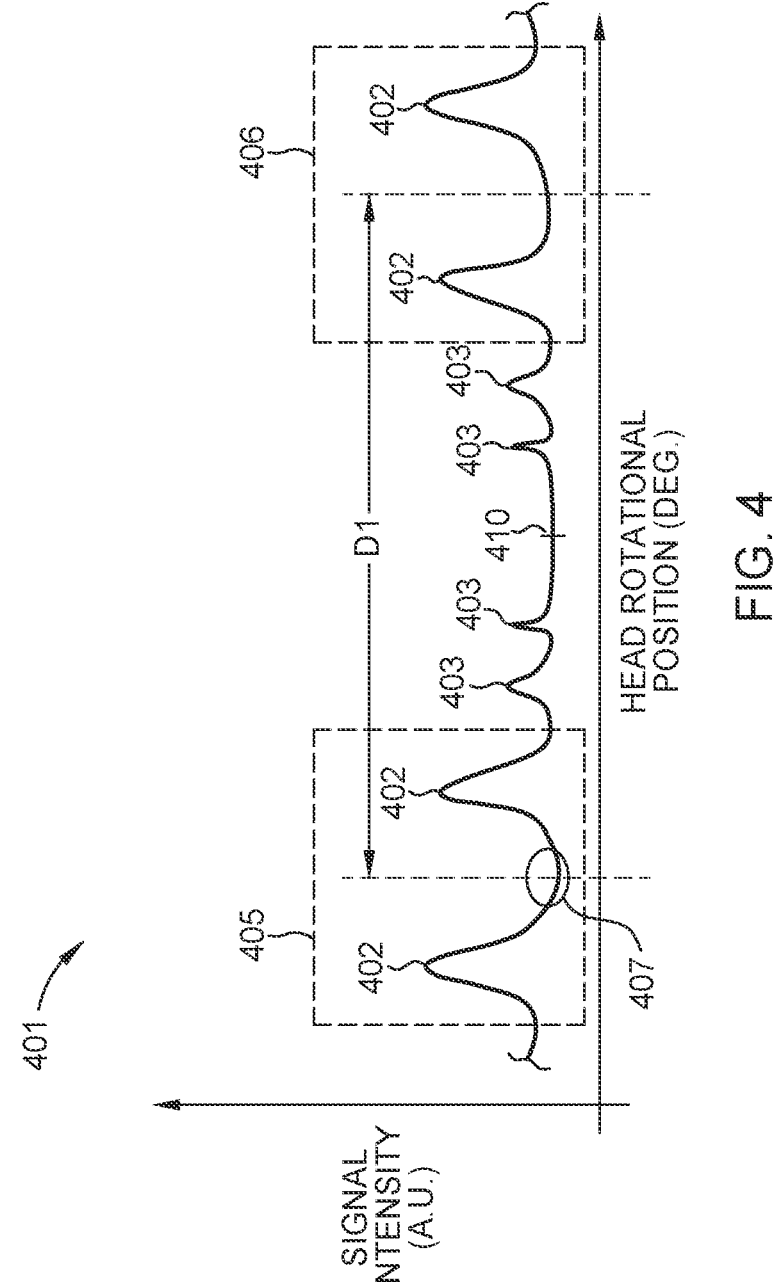
FIG. 4 depicts an exemplary signal obtained by an orientation sensor of the polishing station of FIG. 2A according to embodiments described herein.

FIG. 4 illustrates a graph 400 an exemplary signal 401 of the data collected by the orientation sensor 250 as it scanned the front side of the rotating substrate 115. This signal 401 shows the signal intensity at different rotational positions of the carrier head 210. This scanned substrate 115 has a different front surface than the front surface 230 shown in FIG. 2B and FIG. 3B. However, the scanned substrate 115 has a front surface with similar features as described to the front surface 230. Thus, the same reference signs will be used to explain the analysis of the signal 401. Additionally, the signal produced by the orientation sensor 250 will depend on the shape and/or material of the non-patterned portion 234 and patterned portion 232. Thus, signal 401 shown in FIG. 4 is merely an example of one signal obtained during a scan of an exemplary substrate 115 to explain how the controller 190 is able to locate the reference mark 236.

The X-axis in FIG. 4 shows the rotational position of the carrier head 210. The Y-axis of the graph 400 shows the signal intensity in arbitrary units (A.U.) at the rotational position of the carrier head 210. The signal intensity fluctuates across the rotational orientation of the head 210. This is because the signal reflects the properties of the material scanned. In some embodiments, the orientation sensor 250 may register a more intense signal when scanning the material of the non-patterned portion 234 than material on the patterned portion 232. For example, the orientation sensor 250 may register a more intense signal for the barrier material on the non-patterned surface 234 than the material covering the patterned surface 232. A more intense signal may be registered even if the underlying barrier material on the non-patterned portion 234 is partially underneath a layer formed on both the patterned portion 232 and non-patterned portion 234. The signal intensity may correspond to the size of the area of the non-patterned portion 234 scanned by the orientation sensor 250. In other words, variations in the area of the non-patterned portion 234 lead to variations in the signal. For example, the large spikes 402 in the signal 401 correspond to a portion of the non-patterned surface 234 with a larger surface area than the surface area of the non-patterned surface 234 corresponding to the smaller spikes 403. The differences in area variation in the non-pattered portion 234 may be detected even if the front surface 230 is fully or partially covered by a layer. However, the overall signal intensity may be lower or higher for a substrate 115 with a layer formed over the front surface 230 than the signal intensity obtained when scanning a substrate 115 that does not have a layer at least partially covering both the patterned portion 232 and the non-patterned portion 234. For example, the signal is higher if the layer covering both the patterned portion 232 and non-patterned portion 234 is composed of a conductive material, such as a metal.

The signal 401 will generally repeat in some embodiments, as shown in FIG. 4, due to the symmetry of the non-patterned surface 234 about the first line of symmetry 235. Thus, a pattern is present in the signal 401 that the controller 190 can analyze to find the location of the reference mark 236 relative to the carrier head 210, and thus the rotational orientation of the substrate 115 within the carrier head 210. In some embodiments, the analysis of the signal 401 includes determining a candidate for the part of the signal corresponding to the portion of the substrate 115 including the reference mark 236. The candidate is then analyzed for a reference mark signature 407 that corresponds with the reference mark 236. Once the reference mark signature 407 is found, then the controller 190 is able to determine the rotational orientation of the substrate 115 with respect to the carrier head 210.

The signal 401 includes a first pair 405 and a second pair 406 of large spikes 402. FIG. 4 shows each pair of spikes 405, 406 disposed in a dashed region for explanation purposes. In this example, the large spikes 402 in the signal 401 correspond to either the first region 237 or the second region 238 of the non-patterned surface 232. The first and second pairs 405, 406 of spikes have a similar signal intensity due to the similarity of the surface area of the first regions 237 and second regions 238. Additionally, 180 degrees of carrier head 210 rotation, shown as D1, is present between the center of the two pairs 405, 406 of spikes. This is expected as it corresponds with the symmetry of the non-patterned surface 234.

Each pair 405, 406 of spikes 402 is a candidate for the signal corresponding to a portion of the substrate 115 that includes the reference mark 236. In other words, each pair of spikes 405, 406 is potentially the portion of the substrate having the first regions 237 that the reference mark 236 is located between. The controller 190 knows that the reference mark 236 is at a rotational position of the carrier head 210 corresponding to one of the candidates. In this case, the reference mark 236 is in the trough between large spikes 402 in one of the first and second pairs 405, 406 of spikes 402. The controller 190 analyzes the signal of the candidates for a reference mark signature 407. In this example, the scanned substrate 115 had a notch for a reference mark 236. The signal 401 shows a slight drop between the first pair 405 of large spikes 402 as compared to the signal between a second pair 406 of large spikes 402. This drop is caused by the notch being a break (e.g., discontinuity) in the non-patterned surface 234 causing the orientation sensor 250 to register a lower signal intensity at a rotational position of the carrier head 210. This drop in the signal is the reference mark signature 407. The reference mark signature 407 may be detected by comparing the signal of the candidate to a threshold, such as a threshold signal intensity. Thus, the reference mark 236 may be identified if the signal intensity meets or exceeds a threshold value of the signal intensity.

The controller 190 is able to determine that the notch is between the first pair 405 of large spikes 402, with the center of the second pair 406 of large spikes 402 being the point on the opposite side of the substrate 115 opposite the notch. In some embodiments, the controller 190 may use the center of the reference mark signature 407 to determine the rotational position of the notch relative to the carrier head 210. Since the reference mark 236 is at a fixed location of the substrate 115, the controller is able to use the location of the reference mark 236 to determine the rotational orientation of the substrate 115. Additionally, the controller 190 is able to determine that illustrated point 410 in the signal corresponds to a point of the non-patterned surface that is 90 degrees from the reference mark 236 along the outer edge of the substrate 115.

In some embodiments, where the reference mark 236 is a flat surface (e.g., flat, flat edge) rather than a notch, the signal associated with the first region 237 will be different than the second region 238 on the opposing side of the substrate. This is because the flat surface causes the first regions 237 to have less surface area than the second regions 238, since the edge of the substrate on the opposite side of the flat surface is rounded. In certain embodiments, the controller 190 is able to differentiate the signal obtained from the first regions 237 from the signal obtained from the second regions 238 based on this difference in surface area.

Alternatively, a scan of a substrate 115 with a flat surface as a reference mark may result in a reference mark signature 407 that is a drop in the signal intensity. As the carrier head 210 rotates the substrate 115 relative to the orientation sensor 250, the orientation sensor 250 may pass along or outside of the edge of the flat surface. For example, the signal intensity may drop over a period of rotation of the carrier head 210 where the orientation sensor 250 passes from underneath the front surface 230 and is scanning empty space due to the flat reference mark 236. The signal intensity increases again once the orientation sensor 250 passes back under the front surface 230. Thus, the drop in signal intensity is due to the orientation sensor 250 detecting a lack of a material associated with the front surface 230 of the substrate 115. The center of the reference mark 236 may correspond with the center of the drop in the signal intensity.

In some embodiments, the controller 190 may use the drop in the signal intensity between two portions of the signal identified as first region 237 candidates to determine the location of the center of the flat surface relative to the carrier head 210.

Thus, the controller 190 is able to analyze the signal 401 obtained from the orientation sensor 250 to determine portions of the signal that are candidates for the portion of the non-patterned surface 234 that includes the reference mark 236. The portion of the signal that is a candidate may be a pair of spikes in the signal that are offset from one another candidate by 180 degrees. In other words, the controller 190 can identify a pair of candidates on opposite sides of the substrate 115. Once the candidate pair is identified, the controller 190 may analyze each candidate for the reference mark signature 407, such as a decrease in the signal intensity between a pair of spikes that indicates the presence of the reference mark 236. The reference mark signature 407 may be determined by comparing the two candidates to determine which one has the lowest signal intensity between the apex of the spikes.

In some embodiments, the non-patterned surface 234 of the substrate 115 may have a shape that causes the signal to contain two or more pairs of candidates. In other words, other portions of the non-patterned surface 234 may have a surface area similar to first regions 237 and second regions 238. The controller 190 analyzes each pair of candidates to determine which one has a reference mark signature 407. The detection of the reference mark signature 407 allows the controller 190 to determine where the reference mark 236 is in relation to the carrier head 210.

In some embodiments, the controller 190 may stop the analysis once the reference mark signature 407 is found prior to analyzing all the candidates. For example, the controller 190 may identify multiple candidates. The controller 190 then analyzes each candidate until the reference mark signature 407 is found. The non-analyzed candidates may not be analyzed by the controller 190 once the reference mark signature 407 is found. In some embodiments, however, each candidate is analyzed regardless of the reference mark signature 407 being found. For example, each candidate may be analyzed to confirm that the reference mark signature 407 was not a false positive.

In some embodiments, controller 190 locates the reference mark signature 407 by comparing the signal intensity of two or more candidates to a threshold. In other embodiments, the controller 190 is able to determine the location of the reference mark 236 once the threshold is met or exceeded without the controller 190 making a comparison between multiple candidates. In other words, the controller 190 may be able to locate the reference mark 236 after a partial revolution of the substrate 115, and thus the carrier head 210, that is sufficient to locate the reference mark 236.

In some embodiments, the controller 190 locates the reference mark signature 407 without identifying candidates. For example, the controller 190 may compare the signal 401 to a threshold. The reference mark signature 407 is identified when the signal 401 meets or exceeds the threshold. By way of example, the reference mark signature 407 may be a drop in signal intensity to a threshold value of signal intensity. In some embodiments, the controller 190 may compare the reference mark signature 407 to other features in the signal to confirm the location of the reference mark has been identified. For example, the controller 190 may compare the location of the reference mark signature with a signature associated with the first regions 237.

In some embodiments, the non-patterned portion 234 is not symmetrical about a line of symmetry. The controller 190 analyzes the signal to a threshold value, such as a threshold signal intensity, to determine the reference mark signature. For example, the controller 190 may analyze the signal for a drop that exceeds a signal intensity threshold. In some embodiments, the substrate 115 with the asymmetrical non-patterned portion may include region near the reference mark that produces a signal when scanned that the controller 190 can identify as a candidate for the portion of the substrate including the reference mark. This candidate is then analyzed for a reference mark signature 407.

The CMP System 100 may process one or more types of substrates 115 to complete one or more polishing operation. The shape of the non-patterned surface 234 is substantially consistent across substrates of the same type. As a result, the orientation sensor 250 should produce a similar signal for each substrate of the same type, whether or not the non-patterned surface 234 is symmetrical about a line of symmetry. Thus, each type of substrate may have a reference signal stored in the controller 190 that includes a reference signature indicating the location of the reference mark 236. The type of substrate 115 may be input into the controller 190 to enable the controller 190 to determine the location of the reference mark 236 by comparing actual signal from the orientation sensor 250 to the reference signal.

Additionally, the material on the front surface 230 will be consistent since the CMP process will be repeating the same desired polishing operation for each type of substrate 115. For example, a scan may be made to find the reference mark 236 at a second polishing station 124 after polishing a first layer to a desired height at a first polishing station. Thus, the orientation sensor 250 should produce a similar signal for each substrate of the same type at the same stage of the polishing operation. The stage of the process may also be input into the controller 190, in addition to the substrate type, to enable the controller 190 to determine the location of the reference mark 236 by comparing actual signal from the orientation sensor 250 to the reference signal.

In some embodiments, the reference signal is the signal of the candidates and the reference mark signature is a portion of the signal of the candidate that meets or exceeds a threshold. In some embodiments, the actual signal is overlaid with the reference signal to determine the location of the reference mark. For example, the reference signal may be translated a number of degrees to roughly align the reference signal with the actual signal to determine the reference mark signature, such as by aligning the reference mark signature 407 with a reference signature of the reference signal.

During a CMP process, the controller 190 uses the information gathered from the platen encoder 195, first head encoder 196, and second head encoder 197 to determine and track the position of the carrier head 210 relative to the platen 202. In other words, the controller 190 knows where the carrier head 210 is above the rotating platen 202 at any given point in time, including knowing the rotational orientation of the carrier head 210 relative to the platen 202. Once the controller 190 ascertains the rotational orientation of the substrate 115 relative to the carrier head 210, then the controller 190 similarly knows the rotational orientation and position of the substrate 115 relative to the rotating platen 202 and endpoint sensors 224 at any given point in time of the polishing process.

The controller 190 uses the positional information of the substrate 115 and platen 202 to determine which portions of the front surface 230 are scanned by each endpoint sensor 224 during the endpoint analysis. In other words, since the position and rotational orientation of the substrate 115 relative to the head 210 and platen 202 is known, the controller 190 is able to correlate the data collected by the endpoint sensors 224 to a known location on the front surface 230. The sweep position of the head 210 relative to the platen 202 and the rotation of both the carrier head 210 and platen 202 may be coordinated such that each endpoint sensor 224 traverses the same scan path multiple times during the CMP process to scan the same area (e.g., same region) of the front surface 230. Obtaining data from the same area over the substrate repeatedly improves the signal to noise ratio of the data obtained by the endpoint sensors 224 since a consistent signal will be obtained by the endpoint sensor 224 at each scan that reflects the progression of the polishing process over time. Improving the signal to noise ratio improves the endpoint analysis, allowing for a more accurate determination of when the endpoint is reached to produce a desired and uniform polish across the patterned surface 232.

In conventional CMP processes, the orientation of the substrate 115 is not known after the transfer to the second polishing station 124. As a result, the controller does not know what parts of the substrate are being scanned during the endpoint analysis because the collected data cannot be correlated with a known location on the surface of the substrate. Thus, the endpoint analysis in a conventional CMP process is based on random portions of the substrate 115 scanned by the endpoint sensors. The CMP process disclosed herein, where the endpoint sensor data is correlated to known locations on the substrate 115, improves the endpoint analysis because controller 190 and operator are able to evaluate the CMP process over time over a known area of the substrate.

Figure 5:
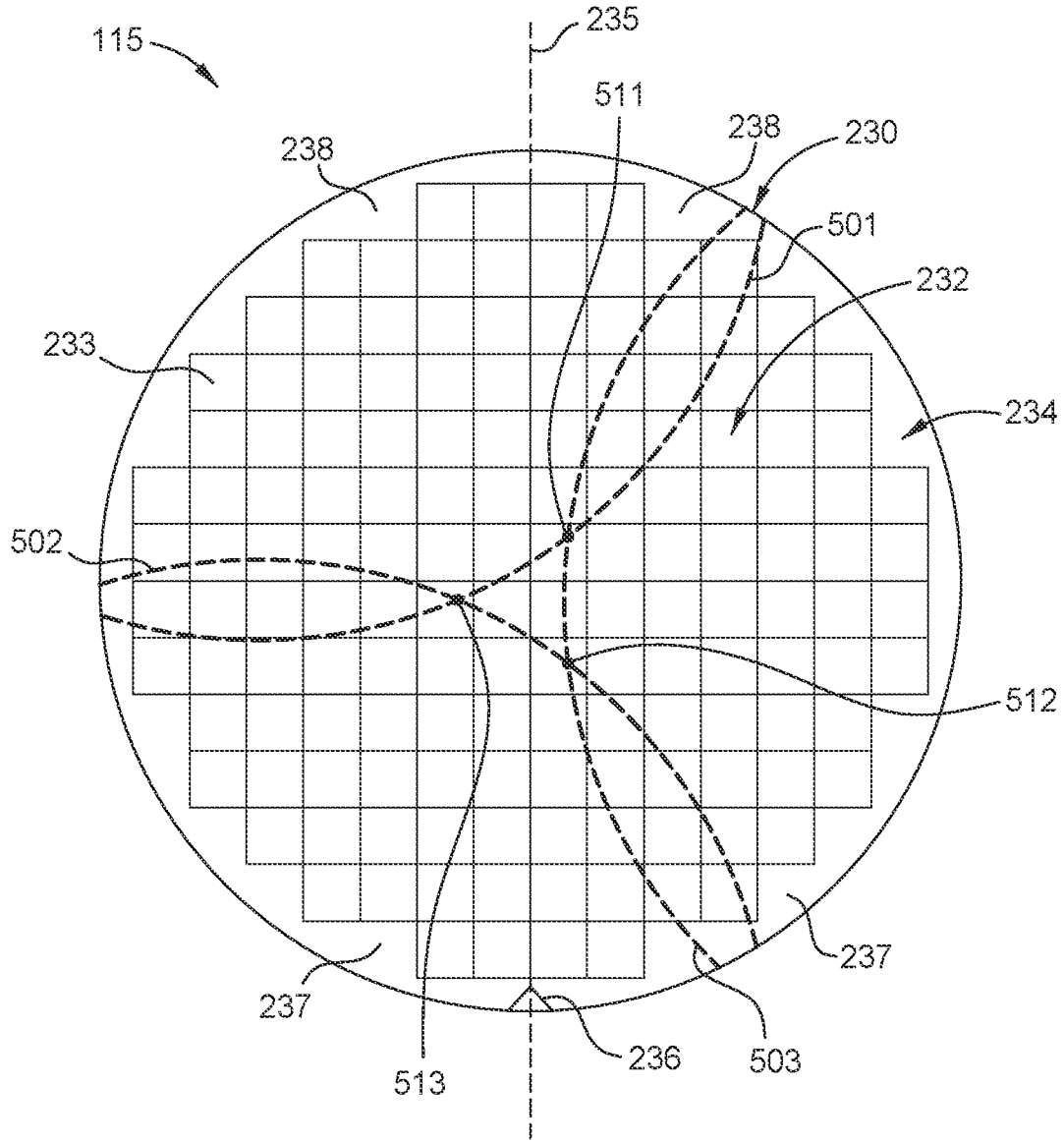
FIG. 5 depicts a top view of a front surface of a substrate showing the scan paths of endpoint sensors of the polishing station of FIG. 2A according to embodiments described herein.

FIG. 5 illustrates the top view of substrate 115 shown in FIG. 2B showing an exemplary first endpoint scan path 501, an exemplary second endpoint scan path 502, and an exemplary third endpoint scan path 503 across the front surface 230. Each endpoint scan path 501, 502, 503 corresponds the path of a respective endpoint sensor 224 of the polishing station 124 shown in FIG. 3A (see windows 227) takes as it passes below the front surface 230. As shown, each endpoint scan path is in the shape of an arc due to the motion of the carrier head 210 and the platen 202 during polishing. Each endpoint sensor 224 scans the outer surface along the respective endpoint scan path 501, 502, 503 multiple times during a CMP process to facilitate the endpoint analysis. The data obtained by the endpoint sensors 224 along its scan path is used during the endpoint analysis to determine when the endpoint of the polish is reached. The orientation of scans paths relative to one another may vary depending on the location of the endpoint sensors 224 relative to one another.

Additionally, the controller 190 may analyze the data obtained where the scan path of two or more endpoint sensors 224 cross to evaluate the endpoint of the CMP process. For example, the controller 190 may analyze the data obtained at point 511, where the first scan path 501 and third scan path 503 cross, to analyze the endpoint of the CMP process. This data may be used to plot a trace of the CMP process. Additionally, the controller 190 may analyze the data obtained at point 512, where the second scan path 502 and third scan path 503 cross, and point 513, where the first scan path 501 and second scan path 502 cross, to evaluate the endpoint of the CMP process. The data obtained at each point 511, 512, 513 may be used to plot a separate trace of the endpoint process during the endpoint analysis. In some embodiments, the controller 190 may also compare the data obtained where the scan path of two or more endpoint sensors 224 cross to confirm that the data obtained from each endpoint sensor 224 is consistent.

The controller 190 is able to use the positon and orientation of the substrate 115 to correlate the data obtained by an endpoint sensor 224 with each specific die 233 along the scan path of the endpoint sensor 224. Thus, the endpoint of the CMP process may be evaluated based one or more particular dies 233.

In some embodiments, the position of the carrier head 210 and platen 202 may be coordinated such that an endpoint sensor 224 passes below a desired die 233 one or more times during the CMP process to evaluate the progression of the CMP process for that specific die 233. In some embodiments, the carrier head 210 and platen 202 may be coordinated such that the end point sensor 224 oscillates between different scan paths along the front surface 230.

In some embodiments, the carrier head 210 may be moved to the scan position one or more times during a CMP process to allow the orientation sensor 250 scan the edge of the substrate 115 to determine the rotational orientation of the substrate 115 relative to the carrier head 210. If the rotational orientation of the substrate 115 has changed, then the controller 190 is able to use the updated orientation during the endpoint analysis.

Figure 6:
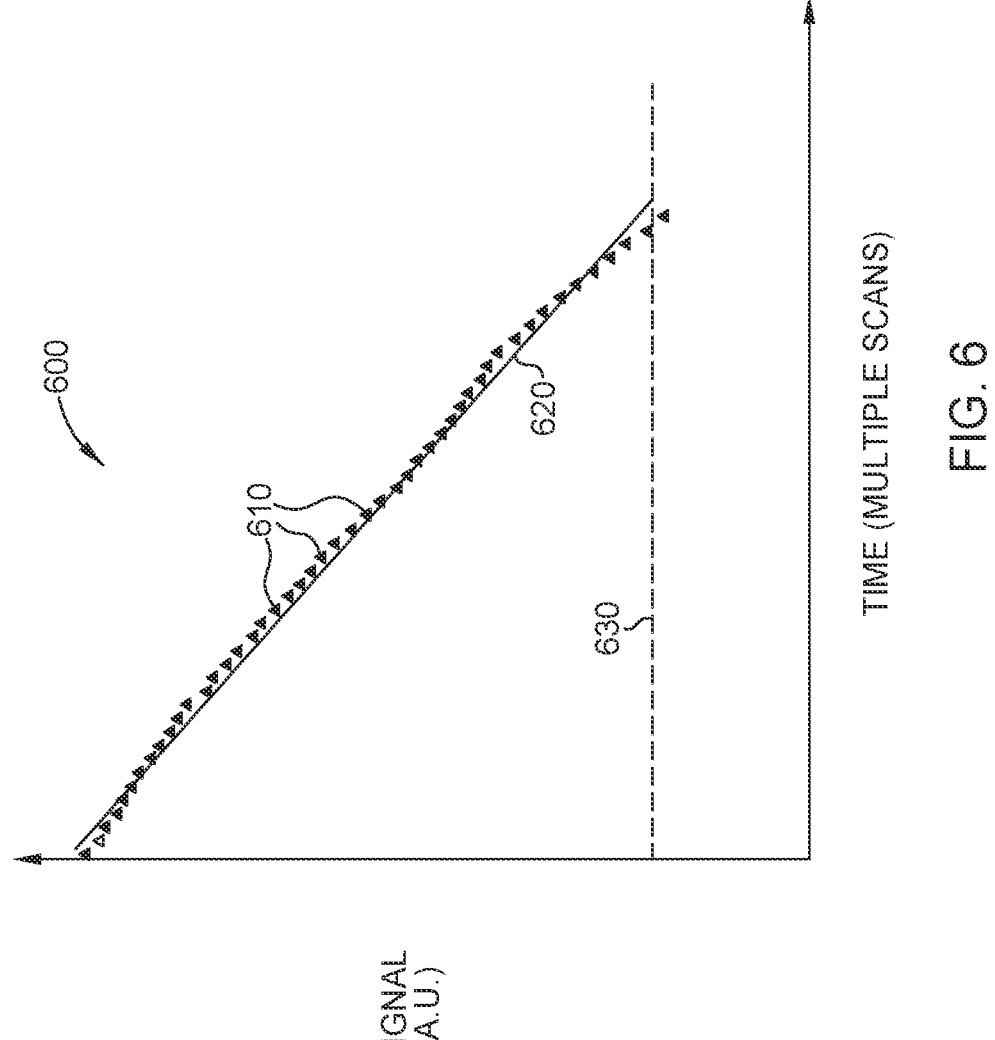
FIG. 6 illustrates a graph of an example trace obtained by an endpoint sensor during a CMP process.

FIG. 6 shows a trace 600 generated from the data obtained from an endpoint sensor 224 during a CMP process. This trace 600 may be used during the endpoint analysis to determine when the endpoint of the polish has been reached. A separate trace 600 may be made for each endpoint sensor 224 to enable the evaluation of the CMP process at different points on the surface of the substrate. For example, the progression of the trace 600 may be used to change the pressure applied to the substrate 115 by the diaphragm 212 to adjust the rate of polishing.

The signal from the endpoint sensors 224 can be sampled to generate one or more measurements 610 for each scan of the end point sensor 224 across the substrate 115. Thus, over multiple scans, the endpoint monitoring system generates a sequence of measured values 610. This sequence of measured values 610 comprises the trace 600. In some implementations, measurements within a scan or from multiple scans can be averaged or filtered, e.g., a running average can be calculated, to generate the measurements 610 of the trace 600. For example, each measured value 610 may reflect a measurement made where the path of two or more endpoint sensors crossed to scan the same area of the front surface 230. The accuracy of the trace 600 is increased since the endpoint sensor 224 is scanning the same area of substrate to obtain the measured value 610.

The sequence of measured values 610 can be used to determine an endpoint or a change to the polishing parameters, e.g., to reduce within-wafer non-uniformity. For example, a function 620 (of measured value versus time) can be fit to the measured values 610. The function 620 can be a polynomial function, e.g., a linear function. An endpoint can be predicted based on a calculated time at which the linear function 620 reaches a target value 630. In some embodiments, the endpoint is reached when the trace 600 passes a threshold. In some embodiments, the trace may reflect a measurement from the endpoint sensor at a particular die on the surface of the substrate. Thus, the endpoint of a particular die on the substrate can be evaluated during the CMP process.

Figures 7A, 7B, 7C, 7D:
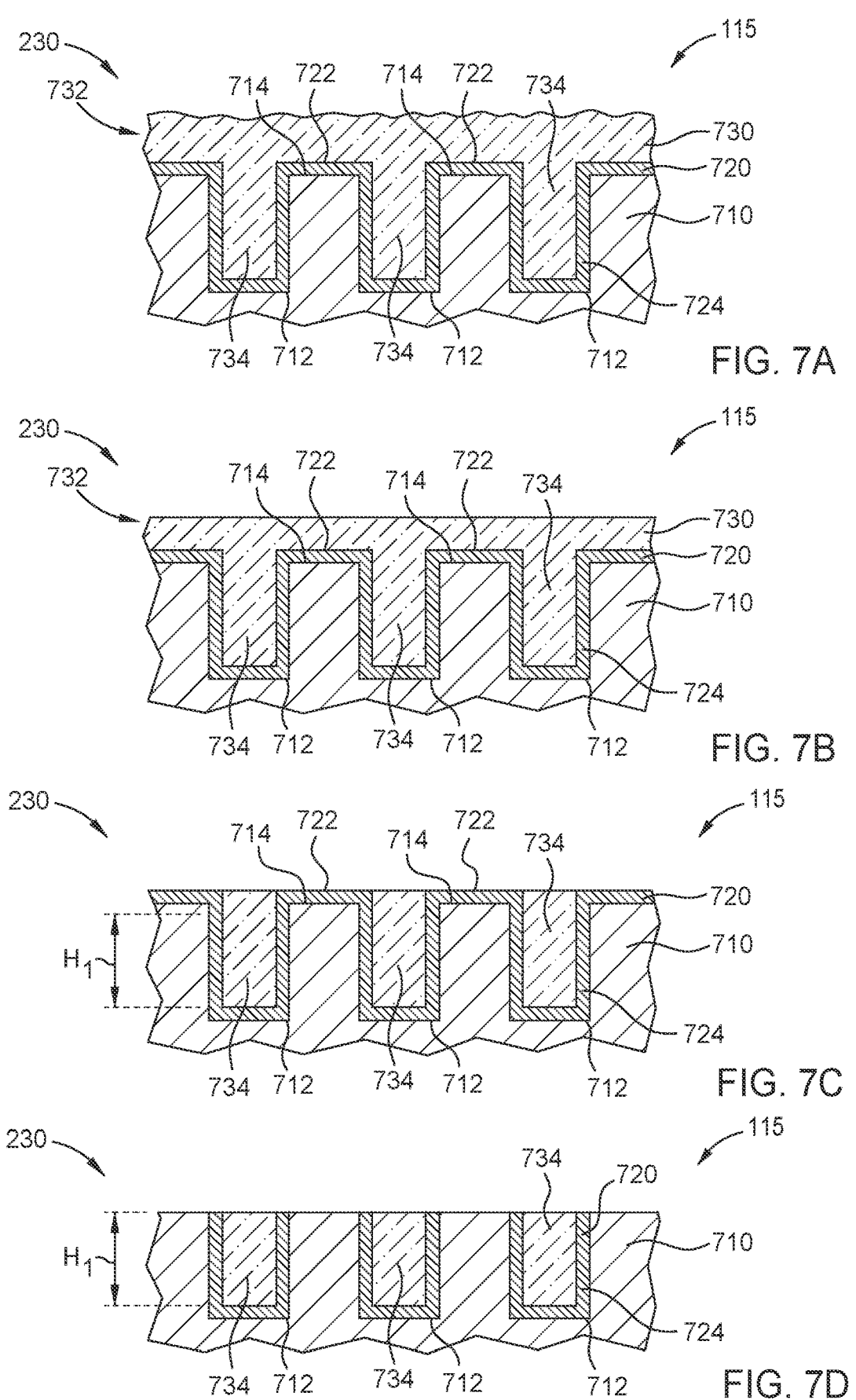
FIG. 7A illustrates a partial cross-sectional view of a substrate to be polished in a first polishing station of the CMP system of FIG. 1 according to embodiment's described herein.
FIG. 7B illustrates a partial cross-sectional view of the substrate after being polished in the first polishing station of the CMP system of FIG. 1 according to embodiments described herein.
FIG. 7C illustrates a partial cross-sectional view of the substrate being polished on a second polishing station of the CMP system of FIG. 1 according to embodiments described herein.
FIG. 7D illustrates a partial cross-sectional view of the substrate after being polished on the second polishing station of the CMP system of FIG. 1 according to embodiments described herein.

FIGS. 7A-7D are cross-sectional views of the substrate 115 at different stages of a CMP process to show an example of a copper CMP process using the CMP system 100 disclosed herein. FIG. 7A illustrates the patterned portion

732 of the substrate 115 prior to undergoing the CMP process in a first processing station 124. The substrate 115 includes a dialectic layer 710 with a plurality of trenches 712. A barrier layer 720 is deposited on the dialectic layer 710, and a copper layer 730 is deposited on top of the barrier layer 720. The substrate 115 is transferred from a cassette 114 to the load cup 122. The substrate 115 is retrieved from the load cup 122 by a carrier head 210 and transferred to the first polishing station 124. The rotational orientation of the substrate 115 relative to the carrier head 210 may be known by scanning the substrate 115 with the pre-aligner 118 prior to placing the substrate 115 in the load cup 122. Thus, the first polishing station 124 does not have an orientation sensor 250. The substrate 115 is urged against the polishing pad 204 to polish the upper portion 732 of the copper layer 730 that is deposited on the upper portion 722 of the barrier layer 720 deposited on the field 714 of the dialectic layer 710.

A plurality of endpoint sensors 224 of the first polishing station 124 monitor the progression of the polish of the copper layer 730. The endpoint sensor 224 may be an eddy current sensor since the copper layer 730 is a continuous layer across the patterned surface 232. The controller 190 evaluates the data obtained by the endpoint sensors 224 to determine when the endpoint of the polish of the upper portion 732 of the copper layer 730 is reached, causing the carrier head 210 to raise the substrate off the pad 204 and/or causing the carrier head 210 and/or platen 202 to stop rotating. For example, the endpoint may be reached when the trace reaches a target value corresponding to when the upper portion 732 of the copper layer 730 reaches a desired thickness. This thickness may be selected to avoid fully removing the upper portion 732 under a high downforce polish on the first station 124 to avoid excessive dishing of the surface of the copper trenches 734. FIG. 7B shows the substrate 115 once the desired thickness of the upper portion 732 of the copper layer 730 is reached.

The substrate 115 may be polished in a two station or a three-station CMP process. In the two polishing station copper CMP process, the substrate 115 continues to be polished on the first station 124 but under a much lower downforce to clear the remaining copper 732 over the upper portion 722 of the barrier layer 720 at a much lower copper removal rate. The controller 190 evaluates the data obtained by the endpoint sensors 224 to determine whether the endpoint of the polish of the upper portion 732 is reached to expose the separated copper trenches 734 and upper portion 722 of the barrier layer 720. The carrier head 210 then moves the substrate to a second polishing station 124 for additional processing. In the three polishing station copper CMP process, the substrate 115 is moved to a second polishing station 124 by the carrier head 210 to clear the remaining copper over the upper portion 722 of the barrier layer 720. This copper clearing process is also monitored by the endpoint sensors 224 equipped on the polishing station 124 to determine when the endpoint of the polish is reached. The carrier head 210 then moves the substrate to a third polishing station 124 for additional processing. FIG. 7C illustrates the substrate 115 after the copper layer 730 is cleared from the upper portion 722 of the barrier layer 720 in either the two-station or the three-station copper CMP process.

In the two station copper CMP process, the second polishing station 124 and carrier head 210 will be used to polish the front surface 230 to achieve a desired height of the copper trench 734 which is shown as H1 in FIGS. 7C and 7D. The desired height H1 is based on the desired resistance of the copper in the trench 734. In other words, the height H1 is selected based on the desired resistance in the circuit formed by the copper trench line 734. In a three station copper CMP process, the third polishing station 124 and the carrier head 210 will be used to polish the front surface to achieve the desired height H1 of the copper trench 734.

After the carrier head 210 and substrate 115 are moved to the polishing station 124 for polishing to achieve the height H1 of the copper trench 734, the carrier head 210 is placed in the scan position to take a scan of the substrate 115 with the orientation sensor 250. The data obtained during the scan is analyzed to find the location of the reference mark 236 relative to the carrier head 210, which indicates the rotational orientation of the substrate 115 relative to the carrier head 210.

The substrate 115 is polished after the controller 190 determines the rotational orientation of the substrate 115 relative to the carrier head 210. FIGS. 7C and 7D show the progression of the CMP process on the substrate 115 in the second or third processing station 124 to achieve the desired height H1 of the copper trench 734 after the upper portion 732 is completely removed. An upper portion 722 of the barrier layer 720 deposited on a field 714 of the dielectric layer 710 is also removed as the front surface 230 is polished as shown in the difference in FIGS. 7C and 7D. The field 714 of the dielectric layer 710 may be polished in order to achieve a desired height H1 of the copper trench 734. The endpoint of the process is reached when, as shown in FIG. 7D, the copper trenches 734 each have reached the desired height H1. Each trench 734 is separated from the dielectric layer 710 by the trench portion 724 of the barrier layer 720.

The endpoint sensors 224 of the polishing station 124 monitor the progression of the barrier layer 720 and dielectric layer 710 polish of the substrate 115 to determine when the copper trench 734 reaches the desired height H1. In some embodiments, the endpoint sensors 224 are inductive current sensor configured to monitor the endpoint of the polishing of the copper trenches 734. For example, the endpoint of the polishing process taking place on the second station 124 may be reached when the trace reaches a target value corresponding a desired copper trench height H1. Once the endpoint is reached, the substrate 115 is then removed from the second station 124 and passed through the CMP system 100 back to a cassette 114.

Figures 8, 9:
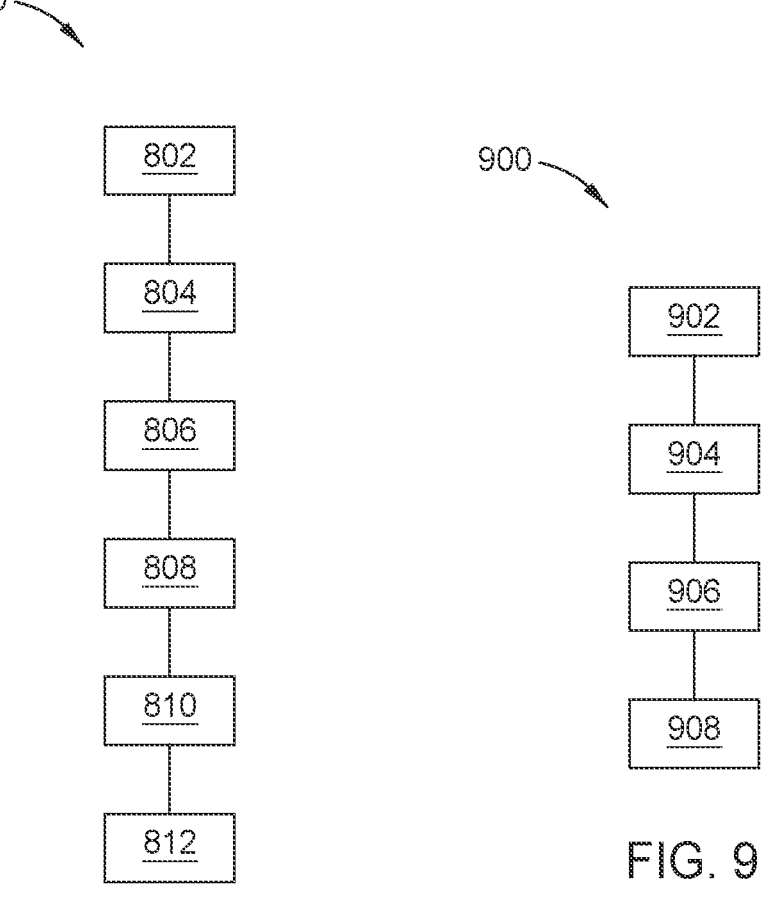
FIG. 8 is a flowchart of a method of processing a substrate according to embodiments described herein.
FIG. 9 is a flowchart of a method of processing a substrate according to embodiments described herein.

FIG. 8 illustrates a flow chart of an exemplary method 800 of processing a substrate. The controller 190 may control each operation of the method 800.

At operation 802, the substrate 115 is polished on a first pad 204 coupled to a first platen 202 of a first polishing station 124. One or more endpoint sensors 224 may monitor the endpoint of the polish of the front surface 230 of the substrate 115.

At operation 804, the substrate 115 is transferred to a pad 204 of a second polishing station 124 by a carrier head 210. Operation 804 occurs after the first polishing station 124 completes the polish of the substrate 115.

At operation 806, the carrier head 210 moves to a scan positon to place the edge of the substrate 115 above an orientation sensor 250 disposed at the rotation center of the platen 202 coupled to the pad 204.

At operation 808, the orientation sensor 250 scans the edge of the substrate 115 to produce a signal. The carrier head 210 rotates the substrate 115 relative to the platen 202 and the orientation sensor 250 during the scan of the edge.

At operation 810, the signal is analyzed to located the reference mark 236 of the substrate 115 to determine the rotational orientation of the substrate 115 relative to the carrier head 210.

In some embodiments, operation 810 includes determining one or more candidates in the signal for a portion of the substrate 115 including the reference mark 236. The one or more candidates are then analyzed for a reference mark signature. In some embodiments, the reference mark signature is a drop in the intensity of the signal. In some embodiments, the reference mark signature is identified when the drop in the signal intensity reaches or exceeds a threshold.

In some embodiments, operation 810 includes identifying at least one pair of candidates for a portion of the substrate including the reference mark that are located 180 degrees apart. Each candidate is then analyzed for a reference mark signature.

In some embodiments, operation 810 includes analyzing the signal to identify a reference mark signature. In some embodiments, the reference mark signature is identify by comparing the signal to a threshold. In some embodiments, the reference mark signature is identified after a partial revolution of the carrier head 210 relative to the orientation sensor 250. In some embodiments, the reference mark signature is identified by comparing the signal to a reference signal for a substrate of the same type.

At operation 812, the front surface 230 of the substrate 115 is polished within the second polishing station by rotating the pad 204 and the carrier head 210 simultaneously. The diaphragm 212 within the carrier head 210 urges the substrate against the pad 204. One or more endpoint sensors 224 monitor the endpoint of the polishing operation performed in the second polishing station. These endpoint sensors 224 obtain data used to determine the endpoint of the polishing process.

In some embodiments of operation 812, the rotational orientation of the substrate 115 relative to the carrier head 210 is used to determine which portions of the front surface 230 is being scanned along a scan path of each end point sensor 224. The movement and rotation of the carrier head 210 and the rotation of the platen 202 may be coordinated such that each endpoint sensor 224 moves along the same scan path a plurality of times during the polishing process to obtain data of the front surface along the scan path.

In some embodiments of operation 812, a first die of a plurality of dies 233 formed on the pattern surface 232 is selected for endpoint analysis. The rotation and position of the carrier head 210 and the rotation of the platen 202 are coordinated to scan the first die. The first die may be scanned once or it may be scanned a plurality of times during the polishing process.

In some embodiments of operation 812, the carrier head 210 may be moved to the scan position one or more times to allow the orientation sensor 250 scan the edge of the substrate 115 to determine the rotational orientation of the substrate 115 relative to the carrier head 210. If the rotational orientation of the substrate 115 has changed, then the controller 190 is able to use the updated orientation to perform the endpoint analysis.

FIG. 9 illustrates a flow chart of an exemplary method 900 of processing a substrate 115. The controller 190 may control each operation of the method 900.

At operation 902, the orientation sensor 250 located at the rotation center of a platen 202 scans the edge of the substrate 115.

At operation 904, the data obtained by the orientation sensor is used to determine a location of a reference mark of the substrate in relation to a carrier head 210 engaged with (e.g., holding) the substrate 115. In some embodiments, operation 904 includes identifying one or more candidates for a portion of the substrate 115 including the reference mark 236 and then analyzing each candidate for a reference mark signature. In some embodiments, operation 904 includes comparing the data to a threshold. The location of the reference mark is determined when the data meets or exceeds the threshold.

At operation 906, the front surface 230 of the substrate 115 is polished on a pad 204 coupled to a platen 202.

At operation 908, endpoint sensors 224 embedded in the platen 202 scan the front surface 230 during operation 906. The data obtained from the endpoint sensors 224 is used to monitor the progression of the polish to determine when the polishing operation has reached an endpoint. The location of the reference mark 236 in relation to the carrier head 210 is used to identify which portion of the front surface 230 is being scanned by each endpoint sensor. In some embodiments, each endpoint sensor scans the same portion of the front surface 230 a plurality of times during the polishing operation. For example, the position and rotation of the carrier head 210 and the rotation of the platen 202 may be coordinated such that each endpoint sensor 224 repeatedly travels along the same scan path relative to the front surface 230 of the substrate 115 having a known rotational orientation relative to the carrier head 210.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, comprising:
polishing a front surface of a substrate on a first pad coupled to a first platen;
moving a carrier head to a scan position to place an edge of the substrate above an orientation sensor disposed at a rotational center of the first pad;
scanning the edge of the substrate with the orientation sensor to produce a signal; and
analyzing the signal to locate a reference mark of the substrate to determine a rotational orientation of the substrate relative to the carrier head, wherein analyzing the signal to locate the reference mark includes identifying a reference mark signature.

2. The method of claim 1, wherein the reference mark is a notch or a flat surface formed in the edge of the substrate.

3. The method of claim 1, wherein analyzing the signal to locate the reference mark includes:
determining one or more candidates for a portion of the substrate including the reference mark; and
analyzing the one or more candidates to identify the reference mark signature.

4. The method of claim 3, wherein the reference mark signature is a drop in intensity in the signal.

5. The method of claim 4, wherein the reference mark signature is identified by the drop in signal intensity that reaches or exceeds a threshold.

6. The method of claim 1, wherein analyzing the signal to locate the reference mark includes:
identifying at least one pair of candidates for a portion of the substrate including the reference mark that are located 180 degrees apart; and

analyzing each candidate in the pair of candidates to identify the reference mark signature.

7. The method of claim 1, wherein the reference mark signature is identified by comparing the signal to either a threshold or a pre-stored reference signal signature of the reference mark for the type of substrate.

8. The method of claim 1, wherein the reference mark signature is identified after a partial revolution of the carrier head.

9. The method of claim 1, further comprising:
polishing the front surface by rotating the first pad and the carrier head; and
monitoring the front surface with a plurality of endpoint sensors to determine an endpoint of the polishing of the front surface by the first pad.

10. The method of claim 9, wherein the monitoring of the front surface includes:
using the determined rotational orientation of the substrate relative to the carrier head to determine which portion of the front surface is being scanned by each endpoint sensor.

11. The method of claim 9, wherein the monitoring of the front surface includes:
moving each endpoint sensor along a scan path along the front surface a plurality of times to obtain end point data of the front surface along the scan path.

12. The method of claim 9, wherein the monitoring of the front surface includes:
transferring the substrate from the first pad to a second pad that is coupled to a second platen with a carrier head;
scanning the edge of the substrate as it is moved over an orientation sensor disposed at a rotational center of the second pad;
selecting a first die of a plurality of dies formed on the front surface; and
coordinating the rotation and position of the carrier head and the rotation of the second platen to scan the first die.

13. A method of polishing a substrate, comprising:
scanning an edge of a substrate using an orientation sensor located at a rotational center of a platen;
analyzing data obtained by the orientation sensor to determine a location of a reference mark of the substrate in relation to a carrier head holding the substrate, wherein analyzing the signal to locate the reference mark includes identifying a reference mark signature;
polishing a front surface of the substrate; and

monitoring the front surface during polishing with an endpoint sensor embedded in the platen that scans the front surface, wherein monitoring the front surface includes identifying a portion of the front surface being scanned by the endpoint sensor using the determined location of the reference mark in relation to the carrier head.

14. The method of claim 13, wherein analyzing the data obtained by the orientation sensor to determine a location of the reference mark in relation to the carrier head includes:
identifying one or more candidates for a portion of the substrate including the reference mark that are located degrees apart; and
analyzing each candidate to identify the reference mark signature.

15. The method of claim 13, wherein analyzing the data obtained by the orientation sensor to determine a location of the reference mark in relation to the carrier head includes:
comparing the data to a threshold, wherein the location of the reference mark is determined when the threshold is met or exceeded.

16. The method of claim 13, wherein monitoring the front surface includes scanning the identifying portion of the front surface with the endpoint sensor a plurality of times during the polishing of the front surface.

17. A polishing system, comprising:
a polishing station, including:
a platen including a polishing pad;
a carrier head configured to rotate a substrate;
an isotropic electromagnetic sensor embedded in the platen at the rotational center of the platen, wherein the isotropic electromagnetic sensor is configured to scan an edge of a substrate that includes a reference mark;
a plurality of endpoint sensors embedded in the platen around the isotropic electromagnetic sensor, each endpoint sensor configured to monitor a surface of the substrate being polished on the pad; and
a controller in communication with the isotropic electromagnetic sensor and the endpoint sensors, wherein the controller is configured to analyze data obtained by the isotropic electromagnetic sensor to identify a location of the reference mark relative to the carrier head.

18. The polishing system of claim 17, further comprising:
at least one of a metrology tool or a pre-alignment station configured to determine the location of the reference mark before polishing the substrate.

* * * * *